United States Patent [19]

Chivukula et al.

[11] Patent Number: 5,753,945
[45] Date of Patent: May 19, 1998

[54] INTEGRATED CIRCUIT STRUCTURE COMPRISING A ZIRCONIUM TITANIUM OXIDE BARRIER LAYER AND METHOD OF FORMING A ZIRCONIUM TITANIUM OXIDE BARRIER LAYER

[75] Inventors: Vasanta Chivukula, Nepean; Pak K. Leung, Kanata, both of Canada

[73] Assignee: Northern Telecom Limited, Montreal, Canada

[21] Appl. No.: 595,116

[22] Filed: Feb. 1, 1996

Related U.S. Application Data

[60] Provisional application No. 60/000,658, Jun. 29, 1995.

[51] Int. Cl.$^6$ .................................... H01L 29/76
[52] U.S. Cl. ................. 257/295; 438/785; 257/535; 257/532; 257/516
[58] Field of Search ................ 438/785, 648, 438/756; 257/758, 516, 582, 295, 535

[56] References Cited

U.S. PATENT DOCUMENTS

| | | | |
|---|---|---|---|
| 4,758,542 | 7/1988 | Parker | 501/134 |
| 5,122,477 | 6/1992 | Wolters et al. | 437/60 |
| 5,133,129 | 7/1992 | Thomson, Jr. | 29/60 |
| 5,187,638 | 2/1993 | Sandhu et al. | 361/313 |
| 5,198,269 | 3/1993 | Swartz et al. | 427/236 |
| 5,212,620 | 5/1993 | Evans, Jr. et al. | 361/313 |
| 5,326,721 | 7/1994 | Summerfelt | 437/131 |
| 5,330,931 | 7/1994 | Emesh et al. | 437/60 |
| 5,356,843 | 10/1994 | Okuyama et al. | 501/134 |

OTHER PUBLICATIONS

INSPEC on line, 96:5201966 Abstr of "Ferroelectric capacitors for integrated circuits", Conference Article on 1st European Meetin on Integrated Ferroelectrics., Vorotilov, Jul. 1995.

INSPEC on line, 92:4255905 Abstr of "Integration of ferroelectric thin films into non volatile memories", Sinharoy, Journal of Vacuum Sci and Tech, Jul. 1992.

C:12:271129 Abst of "Preparation and invest of laser ablated PZT and PLZT ferroelectric films" Ferroelectrics, Jelinek, 1994.

*Primary Examiner*—C. Warren Ivy
*Assistant Examiner*—Jean F. Vollano
*Attorney, Agent, or Firm*—Angela C. de Wilton

[57] ABSTRACT

An integrated circuit structure including dielectric barrier layer compatible with perovskite ferroelectric materials and comprising zirconium titanium oxide, $ZrTiO_4$, and a method of formation of the dielectric barrier layer by sol gel process is described. The amorphous, mixed oxide barrier layer has excellent dielectric properties up to GHz frequencies, and crystallizes above 800° C., facilitating device processing. In particular, the barrier layer is compatible with lead containing perovskites, including PZT and PLZT ferroelectric dielectrics for example for application in non-volatile memory cells, and high value capacitors for integrated circuits, using silicon or GaAs integrated circuit technologies.

14 Claims, 1 Drawing Sheet

INTEGRATED CIRCUIT STRUCTURE COMPRISING A ZIRCONIUM TITANIUM OXIDE BARRIER LAYER AND METHOD OF FORMING A ZIRCONIUM TITANIUM OXIDE BARRIER LAYER

This application claims benefit of the provisional application Ser. No. 60/000,658 filed Jun. 29, 1995.

FIELD OF THE INVENTION

This invention relates to an integrated circuit structure comprising a barrier layer of zirconium titanium oxide, $ZrTiO_4$, and a method of preparing a zirconium titanium oxide barrier layer for an integrated circuit structure.

BACKGROUND OF THE INVENTION

During the last few years, the use of the ferroelectric materials for random access memory (RAM) elements has reached commercial applications in the semiconductor industry. Ferroelectric memory elements are non-volatile, and programmable with low voltage, e.g. less than 5 V. Other advantages include fast access times (<40 ns), and robustness with respect to virtually unlimited numbers of read and write cycles. These memory elements also have low power consumption, are dense and exhibit radiation hardness.

Ferroelectric materials which have allowed this breakthrough in integrated circuit applications include perovskite structure ferroelectric dielectric compounds, for example, lead zirconate titanate $PbZr_xTi_{1-x}O_3$ (PZT), lead lanthanum zirconium titanate (PLZT), barium titanate (BT), and barium strontium titanate (BST).

Among the known techniques for depositing ferroelectric thin films are RF sputtering, electron beam evaporation, chemical vapour deposition and gas jet deposition. In recent years, chemical methods of depositing PZT and other ferroelectric films have become popular, for example a metallorganic decomposition (MOD) and sol-gel deposition. A sol-gel process provides for ease of preparation and fabrication, i.e. by a spin-on liquid process, at lower capital cost compared with low pressure vacuum techniques. Nevertheless, a sol-gel method can produce ferroelectric dielectric materials of high quality.

Several challenges have to be met in the integration of ferroelectric materials with monolithic integrated circuits. These challenges include the selection of suitable conductive materials for electrodes, selection of barrier layers and capping layers to avoid or control contamination problems, and development of low temperature processes for forming ferroelectric materials in thin films with low film stress. These issues are discussed in copending U.S. Pat. applications, Ser. No. 08-410605, filed 21 Mar. 1995 entitled "Ferroelectric Dielectric for Integrated Circuit Applications at Microwave Frequencies", and Ser. No. 08-3488848 filed 24 Nov. 1994, entitled "Method of Forming a Crystalline Ferroelectric Dielectric Material".

One problem that arises is that a reaction takes place between perovskite ferroelectric dielectric materials e.g. PZT and conventional dielectric barrier layers, including silicon dioxide and silicon nitride during processing at temperatures above 450° C. Diffusion may occur across the interface between PZT and silicon dioxide or silicon nitride. Lead diffusion is a particular concern when using PZT and PLZT, and may cause contamination of other layers or create interface traps that affect device performance.

Furthermore, PZT tends to crack severely when formed on a substrate layer of silicon dioxide or silicon nitride. Thus it is desirable to provide a dielectric barrier layer to isolate the PZT from silicon dioxide or silicon nitride and to provide a more suitable substrate layer for growing a layer of a perovskite ferroelectric dielectric.

Generally, when a dielectric barrier layer is provided as a thin layer of an amorphous material, it is desirable that the barrier layer remains amorphous during subsequent processing. Crystallization is associated with a volume change, creating stress in other layers, which can be detrimental to device performance. Process steps for providing a perovskite ferroelectric dielectric layers may require temperatures between 500° C. and 700° C. for crystallization of the ferroelectric material to obtain a high dielectric constant. Thus, crystallization of a suitable dielectric barrier layer should preferably occur above 700° C., and formation of the barrier layer should otherwise be compatible with known process technologies.

Wolters et al., in U.S. Pat. No. 5,122,477, entitled "Method of Manufacturing a Semiconductor Device Comprising Capacitors Which Form Memory Elements and Comprise a Ferroelectric Dielectric Material Having Multilayer Lower and Upper Electrodes", discuss the use of a thin layer of an oxide of zirconium, titanium or hafnium as a barrier layer between a platinum electrode and a PZT ferroelectric dielectric. These oxide layers are formed by depositing a thin layer of the metal or an alloy of these metals, by sputtering, and then oxidizing the metal layer to form the oxide.

U.S. Pat. No. 5,212,620 to Evans (Radiant Technologies) describes the use of magnesium oxide MgO, titanium oxide $TiO_2$ and zirconium oxide $ZrO_2$, as suitable dielectric barrier layers between ferroelectric PZT or PLZT, and a typical conductive electrode material, e.g. platinum. A layer of the oxide is provided by depositing a thin layer of the metal, which is then oxidized. Nevertheless, neither zirconium oxide, nor titanium oxide are good dielectrics, and $TiO_2$ tends to be semiconducting rather than insulating. Also, these latter materials crystallize at relatively low temperatures, i.e. about 500° C.

In an alternative approach, Sandhu et al. in U.S. Pat. No. 5,187,638 use a conductive oxide, e.g. molybdenum oxide, as a conductive barrier layer between an underlying heavily doped silicon layer and a ferroelectric dielectric material. Advantageously, molybdenum also forms a conductive silicide layer on the substrate.

Swartz et al. in U.S. Pat. No. 5,198,269, entitled "Process for Making Sol Gel Deposited Ferroelectric Thin Films Insensitive to Their Substrates" report that improved quality of perovskite. Ferroelectric materials, including PZT, PLZT and BST, was obtained when these materials are formed on a thin interlayer of $PbTiO_3$ or $SrTiO_3$, because the crystallization of $PbTiO_3$ or $SrTiO_3$ were insensitive to the substrate material.

U.S. Pat. No. 5,326,721 to Summerfelt entitled "Method of Fabricating High Dielectric Constant Oxides On Semiconductors Using a Ge Buffer Layer" describes the formation of a ferroelectric dielectric on a crystalline germanium layer epitaxially grown on a semiconductor substrate, i.e. a GaAs or silicon substrate. The buffer layer prevents the reaction between the ferroelectric dielectric and the semiconductor surface which forms a low dielectric constant oxide at the interface with the ferroelectric layer. However, it is noted that a non lead-containing titanate is required as an additional buffer layer between the Ge layer and a lead containing titanate ferroelectric.

U.S. Pat. No. 5,330,931 to Emesh et al. entitled "Method of Making a Capacitor Structure For An Integrated Circuit", discusses some other suitable materials, for example, $Al_2O_3$, $Ta_2O_5$, AlN, MgO and $SrTiO_3$ for use as dielectric barrier layers compatible with ferroelectric PLZT.

The advantages of some dielectric mixed oxide materials, including doped $ZrTiO_4$ and $ZrO_2$—$SnO_2$—$TiO_2$, as ceramics with large dielectric constants (~45) for high frequency dielectric resonators are highlighted in U.S. Pat. No. 5,356,843 to Okuyama et al., entitled "Dielectric Ceramic Compositions and Dielectric Resonators". On the other hand, these materials are provided in bulk form by sintering at high temperatures, typically 1200° C. to 1500° C. and for extended periods. This method is thus completely incompatible with integrated circuit processing, in which process temperatures are desirably maintained well below 1000° C.

SUMMARY OF THE INVENTION

Thus the present invention seeks to provide a dielectric barrier layer for integrated circuit applications which avoids or reduces the above mentioned problems, and more particularly seeks to provide an integrated circuit structure comprising a dielectric barrier layer which is compatible with device structures comprising ferroelectric dielectrics.

According to one aspect of the present invention there is provided an integrated circuit structure comprising a dielectric barrier layer between a perovskite ferroelectric material and an other material, the barrier layer comprising a layer of zirconium titanium oxide having a composition $ZrTiO_4$.

Preferably the $ZrTiO_4$ comprises a thin layer of amorphous material. The crystallization temperature of the zirconium titanium oxide layer is approximately 800° C., which allows for subsequent processing to be carried out up to 800° C. while still maintaining an amorphous barrier layer. When the ferroelectric material is a lead containing perovskite such as PZT or PLZT, the $ZrTiO_4$ layer provides an effective barrier layer between the ferroelectric and other dielectric layers to prevent interfacial reactions and diffusion of lead. A $ZrTiO_4$ layer was also found to provide a suitable barrier layer on which to provide a layer of conductive electrode material, e.g. platinum metal, which does not adhere well to a conventional dielectric, such as silicon dioxide. For example a layer of $ZrTiO_4$ may be provided as a barrier layer on a semiconductor substrate e.g. Silicon or GaAs, to allow for capacitor electrode materials to be deposited thereon.

According to another aspect of the present invention there is provided a method of forming an integrated circuit structure comprising a dielectric barrier layer disposed between a layer of a perovskite ferroelectric material and another material, wherein the steps of providing the barrier layer comprises depositing an amorphous layer of zirconium titanium oxide of composition $ZrTiO_4$ by a sol-gel process.

Conveniently, a layer of $ZrTiO_4$ may be formed by a sol gel process from a precursor solution comprising a mixture of zirconium and titanium alkoxides, i.e. a mixture of zirconium and titanium propoxides or ethoxides, or from a mixture of a metal alkoxide and a soluble inorganic metal salt, e.g. zirconium propoxide and titanium nitrate. After coating the substrate with a layer of the precursor solution, the coating is heated a low temperature −100° C. to dry, then fired, i.e. heated by rapid thermal processing to a temperature of about −400° C., for one minute, to drive off solvents and volatile organic components. Annealing at a higher temperature, for example, between 500° C. and 700° C. transforms the layer into a uniform amorphous phase of $ZrTiO_4$.

Thus a layer of $ZrTiO_4$ is provided by a relatively low temperature process, compatible with integrated circuit processing.

$ZrTiO_4$ fabricated by this method was found to be a good dielectric, having a dielectric constant of about 40, and provides excellent high frequency characteristics up to about 100 GHz. This dielectric barrier layer is compatible with perovskite ferroelectric dielectrics used in integrated circuits for high frequency (GHz), applications. In particular, the amorphous $ZrTiO_4$ layer provides an effective barrier layer between PLZT and PZT and other materials, including conventional dielectrics such as silicon dioxide and silicon nitride used in silicon processing technology. $ZrTiO_4$ also forms a good dielectric barrier layer on silicon and GaAs substrates, and for a number of conductive electrode materials.

According to a further aspect of the present invention there is provided a method wherein the the sol gel process comprises providing a precursor sol gel solution comprising a mixture of solution of a titanium alkoxide and a solution of a zirconium compound comprising one of a zirconium alkoxide and a soluble zirconium salt, the mixture comprising a one to one ratio of zirconium and titanium provided in a mixture of an organic solvent and water; coating the substrate with a layer of the precursor sol gel solution; heating the precursor layer to dry and further heating the layer to drive off solvent and volatile organic components; annealing the layer at a temperature below 800° C. to form an amorphous layer of $ZrTiO_4$.

According to yet another aspect of the present invention there is provided an integrated circuit including a ferroelectric capacitor structure comprising: first and second conductive electrodes and a layer of a capacitor dielectric comprising a perovskite ferroelectric material disposed between the electrodes, the capacitor structure being isolated by an other dielectric material, and a dielectric barrier layer comprising a layer of amorphous $ZrTiO_4$ provided between the capacitor dielectric and the other dielectric material.

Beneficially, during fabrication of ferroelectric devices structures, a layer of $ZrTiO_4$ may be provided as a dielectric barrier layer for separating and thus isolating other dielectrics, e.g $SiO_2$ and $Si_3N_4$, which would otherwise react with the ferroelectric material during heat processing at elevated temperature.

In other ferroelectric capacitor structures, a $ZrTiO_4$ dielectric barrier layer may take the form of dielectric sidewall spacers to separate ferroelectric dielectrics and conventional dielectrics, thereby preventing reaction and interdiffusion.

Thus the present invention provides an effective barrier layer for integrated circuit applications, with particular application for ferroelectric capacitor structures having perovskite ferroelectric dielectrics, including PZT or PLZT.

BRIEF DESCRIPTION OF THE DRAWINGS

Embodiments of the invention will now be described by way of example, with reference to the accompanying drawings, in which.

DESCRIPTION OF THE PREFERRED EMBODIMENTS

Figure 1:
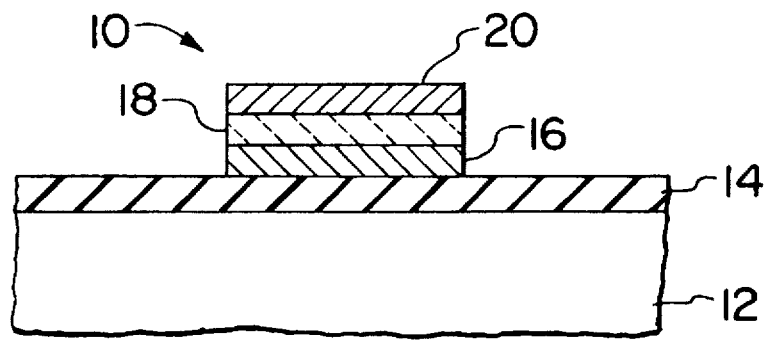
FIG. 1 shows a schematic cross-sectional diagram through part of an integrated circuit comprising a ferroelectric capacitor structure fabricated according to a first embodiment.

Thin films of amorphous zirconium titanium oxide, $ZrTiO_4$ suitable for forming dielectric barrier layers for integrated circuit structures according to a first embodiment of the invention were fabricated by a sol-gel spin-on technique.

A precursor solution for the zirconium titanium oxide was prepared comprising a solution of titanium alkoxide mixed with a solution of a zirconium alkoxide or a soluble zirconium salt, in appropriate stoichiometric proportions to provide a 50/50 ratio of Zr to Ti. Suitable titanium alkoxides include Ti-iso-propoxide or Ti-ethoxide solutions. Suitable zirconium precursor compounds include zirconium propoxide, zirconium oxynitrite $(ZrO(NO_3)_2)$ or zirconium nitrate $(Zr(NO_3))$. The solutions were stabilized with methoxy-ethanol and acetylacetone. If required the pH of the solution is adjusted to stabilize the solution.

Water was added last, to form the desired sol-gel solution of the precursor mixture, having suitable viscosity and surface tension properties for spin-coating onto a substrate.

To form a thin barrier layer of amorphous zirconium titanium oxide, the solution is spin-coated onto a substrate wafer as a wet film. The wet film is dried by heating at relatively low temperature, e.g. about 100° C. for 60 seconds, and then fired at 400° C. by rapid thermal processing to remove volatile organics. Annealing is then carried out at a higher temperature, i.e. at between 500° C. and 800° C. to complete the transformation of the layer to an amorphous $ZrTiO_4$ dielectric layer. The annealing step preferably comprises rapid thermal annealing for a period ~1 minute. Annealing may be carried out in a conventional tube furnace for longer periods, if the latter process is compatible with the substrate processing.

$ZrTiO_4$ prepared as above, for example using Example I, was found to have excellent properties for dielectric barrier layers in semiconductor applications for Si and GaAs based integrated circuits, including applications for high frequency applications at microwave frequencies. While $ZrTiO_4$ is an effective barrier layer for perovskite ferroelectric materials, and particularly for lead containing perovskites, this material may also be used to advantage as a barrier between a semiconductor substrate and other materials.

Doped $ZrTiO_4$ may also be used for barrier layer purposes, and may be provided by adding a suitable proportion of another metal salt, to the precursor sol gel solution. For example, some known $ZrTiO_4$ based mixed oxides, mentioned in the above referenced patent to Okuyama and formed by high temperature sintering include $ZrTiO_4$ in which part of the Zr or Ti is substituted by other metals including Mg, Co, Zn, Ni and Mn.

EXAMPLE I

A sol-gel precursor mixture, is formed from a mixture of appropriate amounts of a titanium and zirconium alkoxides, i.e. Zr-propoxide (10 gms) and Ti-iso-propoxide (6.1 gms) were mixed in a stoichiometric 50/50 Zr/Ti ratio. To this mixture were added methoxyethanol (30 gms), and acetylacetone (10 gms) to stabilize the alkoxide mixture.

It was found that acidification of the mixture by addition of up to 5 gms of nitric acid to the above mixture increases the shelf life time of the gel, preventing the reactions between Ti and Zr propoxides. In the absence of nitric acid, the solution precipitates within 24 hours. Finally, distilled and deionized water (10 gms) is added to the solution mixture, providing a solution of an appropriate viscosity. The solution was spin coated onto a suitable substrate layer of a semiconductor wafer comprising a partially fabricated integrated circuit. The resulting wet films were dried at 100° C. for 60 seconds. The dried films were then "fired", i.e. heated by rapid thermal processing, at 400° C. for 120 seconds to drive off volatile organic components, and then annealed at 500°–650° C. for 300 to 600 seconds.

X-ray diffraction analysis of the annealed films revealed that the films are amorphous $ZrTiO_4$.

In variations of this process, other metal alkoxides may be used with other suitable solvents, acetic acid, and other organic alcohols e.g. methanol, ethanol and propanol. In selecting appropriate salts, solvents and acid or base catalysts, compatibility with integrated circuit processing must be considered in providing high purity reagents, and preferably avoiding compounds having constituents, e.g chloride, which are detrimental in semiconductor device processing.

Figure 2:
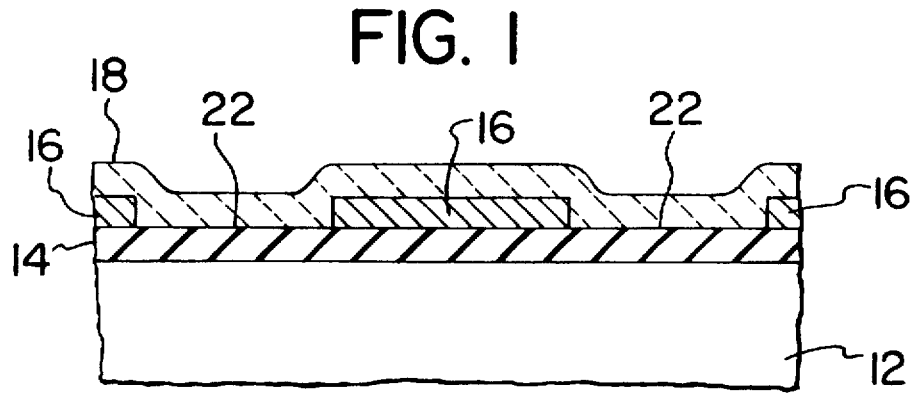
FIG. 2 shows a schematic cross-sectional diagram through part of the integrated circuit structure of FIG. 1 during fabrication thereof.

In application of the barrier layer for fabrication of device structures for an integrated circuit according to a first embodiment of the invention, i.e. a ferroelectric dielectric capacitor 10 as shown in FIG. 1, a barrier layer of $ZrTiO_4$ 14 is formed on a semiconductor substrate layer 12, as detailed above, before deposition of a layer of conductive material, e.g. platinum metal, for formation of a bottom electrode 16. A layer of a ferroelectric dielectric 18 is formed thereon and a second conductive layer defines a second electrode 20. When the conductive layer is patterned to define electrodes 16 as shown in FIG. 2, then the surface 22 of the barrier layer 14 is exposed. During deposition of the ferroelectric capacitor dielectric 18 the barrier layer 14 prevents reaction of the ferroelectric 18 with the underlying substrate, 12.

A barrier layer of $ZrTiO_4$ may be deposited directly on a semiconductor substrate, e.g Si or GaAs, to prevent reaction of the substrate material and the ferroelectric dielectric.

During deposition of PZT on a silicon dioxide substrate layer, a buffer layer of $ZrTiO_4$ prevents reaction of PZT and $SiO_2$, which form unwanted compounds that are difficult to etch.

Since Pt does not adhere well on silicon dioxide, but Pt adheres well to $ZrTiO_4$, a $ZrTiO_4$ layer is beneficially provided as a barrier between silicon dioxide and Pt electrodes. The $ZrTiO_4$ layer provides an better substrate for deposition of metals such as Pt for the bottom electrode formed on a conventional dielectric substrate, since Pt adheres well to this material. It was found to be advantageous when Pt is formed as relatively thin layer <100 Å on the barrier layer.

$ZrTiO_4$ is also a suitable barrier layer for BST type ferroelectric materials and many other dielectric materials that include perovskite ferroelectrics, and other high dielectric constant materials, and conventional dielectrics, e.g. $SiO_2$, $Si_3N_4$.

Figure 3:
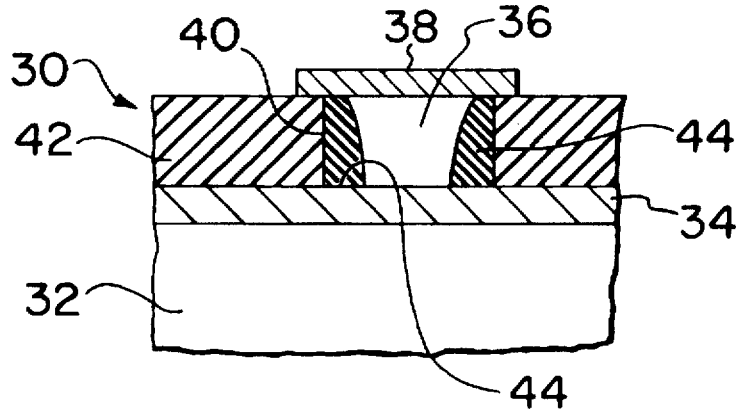
FIG. 3 shows a schematic cross-sectional diagram through part of an integrated circuit comprising a ferroelectric capacitor structure according to a second embodiment.

An integrated circuit comprising a capacitor 30 structure according to a second embodiment is shown in FIG. 3, and includes a ferroelectric dielectric 36 which is provided between conductive electrodes 34 and 38, e.g. platinum electrodes on a substrate 32. The ferroelectric 36 is defined within a via opening 40 defined through a layer of conventional dielectric, e.g. $SiO_2$ 32. A barrier layer 44 comprising $ZrTiO_4$ is provided on sidewalls of the via holes 42, preferably in the form of sidewall spacers 44 of the barrier material, as shown. That is, in formation of the capacitor structure a layer of $ZrTiO_4$ is deposited overall. Within the via opening 40, the layer of $ZrTiO_4$ is anisotropically etched to define the sidewall spacers 44 before filling the via opening with the perovskite ferroelectric dielectric 36. For example, as described in copending U.S. Pat. application Ser. No. 08-348848, the ferroelectric material is formed using a spin-on liquid process to apply to the substrate a metallorganic sol-gel precursor comprising constituents of the ferroelectric material, i.e. an inorganic lead compound, and zirconium and titanium alkoxides in the desired proportions. A layer of the required thickness was obtained by sequentially depositing and heat treating several thin layers. Each layer of as-deposited material was heat treated at low temperature, i.e. below $\leq 450°$ C. for about 90 seconds, to drive off volatile organic components and to form an amorphous layer. The resulting amorphous layer was then annealed by a rapid thermal annealing (RTA) process, preferably in an annealing atmosphere comprising oxygen in the presence of water vapour for 300 seconds. After planarizing the ferroelectric dielectric, a second conductive electrode 38 of the capacitor is then formed comprising another layer of platinum. Thus the layer of $ZrTiO_4$ provides a dielectric barrier layer between the materials of the ferroelectric dielectric and the surrounding dielectric, which is effective in preventing reactions between the ferroelectric capacitor dielectric 36 and the surrounding dielectric material 42.

In other applications, e.g. for forming ferroelectric capacitors in GaAs integrated circuit applications, using e.g. BST ferroelectrics, $ZrTiO_4$ should be a suitable dielectric barrier layer for structures analogous to those described above for silicon integrated circuits. Indeed in fabricating specialized ferroelectric materials (known as bi-layered ferroelectrics) such as bismuth titanate, strontium bismuth tantalum niobium oxide, which are processed at relatively high temperatures ~800° C., it is expected that $ZrTiO_4$ would be particularly suitable as a dielectric barrier layer, in view of its relatively high crystallization temperature, compared with other dielectric barrier layers mentioned above.

What is claimed is:

1. An integrated circuit structure comprising a dielectric barrier layer disposed between a perovskite ferroelectric material and an other material, the barrier layer being provided by a layer of zirconium titanium oxide having a composition $ZrTiO_4$.

2. A structure according to claim 1 wherein the layer of zirconium titanium oxide comprises a layer of an amorphous material.

3. A structure according to claim 1 wherein the other material is selected from the group of dielectrics consisting of silicon dioxide, silicon nitride and silicon oxynitride.

4. A structure according to claim 1 wherein the other material is a conductive material forming an electrode of a ferroelectric capacitor structure.

5. A structure according to claim 1 wherein the perovskite ferroelectric material is selected from the group consisting of lead zirconate titanate and lead lanthanum zirconate titanate and doped compositions thereof.

6. A structure according to claim 1 wherein the perovskite ferroelectric material is selected from the group consisting barium titanate and barium strontium titanate and doped compositions thereof.

7. A structure according to claim 1 wherein the perovskite ferroelectric material includes lead.

8. A structure according to claim 1 wherein the perovskite ferroelectric is selected from the group comprising lead magnesium niobate, and lead niobate, barium doped lead niobate, strontium doped lead niobate, and lead iron niobate.

9. A structure according to claim 1 wherein the perovskite ferroelectric material is selected from the group consisting of bi-layered ferroelectrics including bismuth titanate, strontium bismuth tantalum niobium oxide, strontium bismuth titanium oxide.

10. An integrated circuit including a ferroelectric capacitor structure comprising:

first and second conductive electrodes and a perovskite ferroelectric dielectric material disposed between the electrodes, the capacitor structure being isolated by an other dielectric material, and a dielectric barrier layer provided by a layer of amorphous $ZrTiO_4$ disposed between the ferroelectric dielectric material and the other dielectric material.

11. A structure according to claim 10 wherein the ferroelectric dielectric material is enclosed by another dielectric material and separated therefrom by a barrier layer provided by an amorphous layer of $ZrTiO_4$.

12. A structure according to claim 1 wherein the barrier layer is formed on a semiconductor substrate.

13. A structure according to claim 12 wherein the semiconductor substrate comprises silicon.

14. A structure according to claim 12 wherein the semiconductor substrate comprises GaAs.

* * * * *